Sept. 5, 1967
R. M. SUGARMAN
3,340,526
DIODE DIGITIZER
Filed July 8, 1964
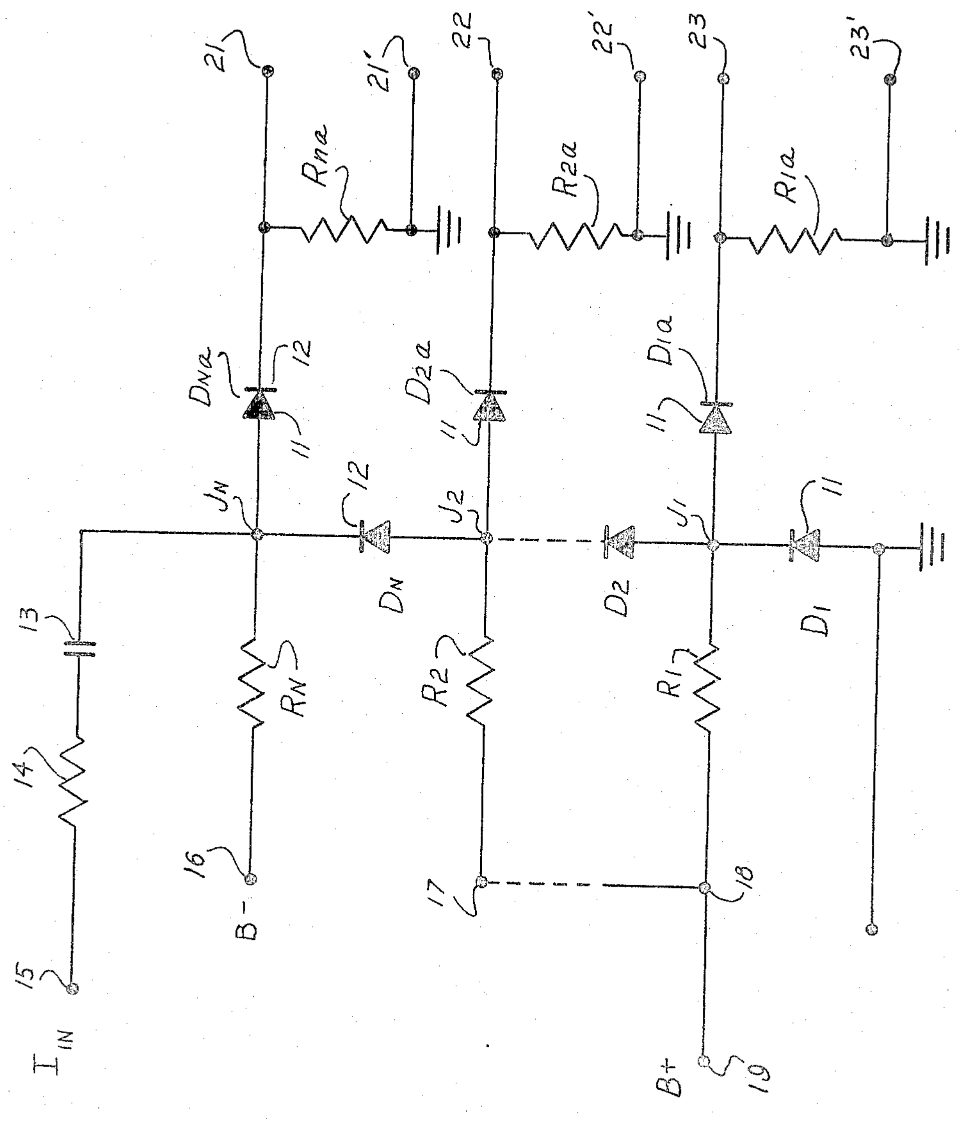
INVENTOR
ROBERT M. SUGARMAN
BY
Dean, Fairbank & Hirsch
ATTORNEYS 3,340,526
DIODE DIGITIZER Robert M. Sugarman, New Rochelle, N.Y., assignor to Chronetics, Inc., Yonkers, N.Y., a corporation of New York Filed July 8, 1964, Ser. No. 381,055
6 Claims. (Cl. 340—347)

This invention relates to the art of measuring devices and more particularly to an electronic measuring device for providing a digital output related to the amplitude of an analog input.

As conducive to an understanding of the invention it is noted that where it is desired to provide a digital output of value related to the amplitude of a voltage pulse, since the digital output is necessarily in discrete steps, it is necessary to switch from step to step as the value of the analog signal increases. Where the switching means involves the use of diodes, tunnel diodes or transistors whose electrical characteristics are a factor in determining the time of switching, these devices would normally have to be matched and be of extremely high tolerances and even if they initially provide precise switching at the desired level or step, due to variations in the characteristics of the diodes in use, malfunctioning of the equipment would result.

Where the devices after switching to provide the desired readout have to be reset for the next signal to be measured, the need for additional circuit elements adds to the bulk and cost of the system.

It is accordingly among the objects of the invention to provide an electronic measuring device which will provide a digital output related to the amplitude of an analog input, which device will operate to measure the amplitude of pulses of extremely short duration of the order of one nanosecond and high repetition frequency, which utilizes relatively few components including diode switches and in which the operation of the device is independent of changes in the electrical characteristics of said diode switches and which device does not have to be reset after each measurement.

According to the invention, the equipment comprises a plurality of series connected diodes through which a current will flow. By reason of circuitry associated with the diodes, the current flow will be progressively less through adjacent diodes and the value of the current flow is predetermined by use of high accuracy resistors and constant voltage sources. Since the diodes have a low forward resistance and the associated resistors are of relatively high value, variations in the electrical characteristics of the diodes will have negligible effect on the value of the current flowing therethrough.

Each series diode has an output diode associated therewith which is cut off when the series diode is conducting and which will conduct when the series diode is cut off, each output diode being in circuit with an output resistor of low resistance value.

An analog signal is applied to the series connected diodes and is of polarity such that the resultant current flow will oppose the current flow through such diodes. Thus, if the analog signal is of value such that the current flow through the series connected diodes resulting therefrom will overcome the initial and opposed current flow through one or more of the series connected diodes, said diodes will cut off and hence the associated output diode will conduct for current flow through the associated output resistor, thereby providing an indication related to the value of the analog signal.

Since the current flow through each of the series connected diodes may accurately be set by use of regulated constant voltage sources and high tolerance resistors which are extremely stable, it is apparent that the digital readout will be extremely accurate.

In the accompanying drawing, the single figure is an illustrative circuit diagram of a measuring device according to one embodiment of the invention.

Referring now to the drawing, the equipment comprises a plurality of series connected diodes $D_1$, $D_2$, $D_N$, the anode 11 of the diode $D_1$ being connected to ground and the cathode 12 of diode $D_N$ being connected to junction $J_N$ and through coupling capacitor 13 and input resistor 14 to input terminal 15.

The junction $J_N$ is connected through resistor $R_N$ to terminal 16 to which a source of negative potential in the order of say −20 volts is connected. The junction $J_2$ between diodes $D_N$ and $D_2$ is connected through resistor $R_2$ to junction 17 and the junction $J_1$ between diodes $D_2$ and $D_1$ is connected through resistor $R_1$ to junction 18, which is connected to junction 17 and also to terminal 19 to which a source of positive potential in the order of say +20 volts is connected. The source of negative and positive potential is a constant voltage source.

Each of the junctions $J_N$, $J_2$, $J_1$ is connected to the anode 11 of an associated output diode $D_{Na}$, $D_{2a}$ and $D_{1a}$, the cathodes 12 of said diodes being connected respectively to output terminals 21, 22, 23 and to one end of an associated resistor $R_{Na}$, $R_{2a}$, $R_{1a}$ of relatively low ohmic value, the other end of each resistor being connected to ground and to output terminals 21', 22', 23'.

When the equipment above described is turned on with no input signal applied to terminal 15, since the negative potential of −20 volts is applied to series connected diodes $D_N$, $D_2$, $D_1$, from terminal 16 to ground, and since the cathodes 12 of said diodes are negative with respect to ground, all of the diodes $D_N$, $D_2$, $D_1$ will conduct. Since the series forward resistance of diodes $D_N$, $D_2$, $D_1$ is very low as compared to the value of resistor $R_N$, i.e., say 20 ohms as compared to 1,000 ohms, and since the negative voltage is from a regulated source, it is apparent that the value of the current flowing through diodes $D_N$, $D_2$, $D_1$ will be substantially independent of the characteristics of the diodes and the only controlling factor will be the value of B− and B+ and the value of the resistors $R_N$.

Since the cathodes of diodes $D_N$, $D_2$, $D_1$ are all negative with respect to ground, the junctions $J_N$, $J_2$, $J_1$ will also be negative with respect to ground. As a result, the anodes 11 of diodes $D_{Na}$, $D_{2a}$, $D_{1a}$ will be negative with respect to their associated cathodes and hence these diodes will be back biased and will not conduct.

At this time, the current flow through diode $D_N$ is greater than the current flow through diode $D_2$ and the current flow through diode $D_2$ is greater than the current flow through diode $D_1$. Such successively decreasing current flow is due to the following:

Current will flow from ground through series connected diodes $D_1$, $D_2$, $D_N$ and resistor $R_N$ to negative terminal 16. At the same time current will flow from positive terminal 19, junctions 18, 17, resistor $R_2$, junction $J_2$, diode $D_N$, resistor $R_N$ to negative terminal 16; from positive terminal 19, junction 18, resistor $R_1$, junction $J_1$, diodes $D_2$, $D_N$, resistor $R_N$, to negative terminal 16 and from ground, diode $D_1$, junction $J_1$, resistors $R_1$, $R_2$, junction $J_2$, diode $D_N$ resistor $R_N$ to negative terminal 16.

As a result, the currents through diodes $D_N$, $D_2$, $D_1$ correspondingly decrease.

At this time a positive pulse is applied to input terminal 15. This pulse which may be a voltage of amplitude proportional to the value of a signal to be measured is to have its value determined by conversion into a digital readout.

Thus, the equipment determines the location of the amplitude of the pulse between a plurality of predetermined ranges of values, the lowest range being proportional to the current through diode $D_1$, the next higher range being proportional to the current through diode $D_2$ and the next higher range being proportional to the current through diode $D_N$.

If a positive pulse is applied between input terminal 15 and ground, there will be additional current flow from terminal 15, through resistor 14, capacitor 13, diodes $D_N$, $D_2$, $D_1$ to ground.

Since it is desired that the equipment be independent of the characteristics of the diodes $D_N$, $D_2$, $D_1$, resistor 14 is large compared to the sum of the series forward resistance of said diodes, i.e., with three diodes, resistor 14 could have a value of 1000 ohms and each of the resistors $R_2$, $R_1$ has a value of say 10,000 ohms.

Thus, as the value of the input signal rises, the signal current rises.

Since the signal current is the same through all the diodes $D_N$, $D_2$, $D_1$ and in opposition to the current originally flowing therethrough from negative terminal 16, if the signal current is less than current through diode $D_1$ from negative terminal 16, the net current through diode $D_1$ would still be negative and diode $D_1$ would remain conducting. Since it requires an even greater opposition current to cause diodes $D_2$ and $D_N$ to cut off, it is apparent that all the output diodes $D_{1a}$, $D_{2a}$, $D_{Na}$ would remain cut off.

When the input pulse provides an input current that is slightly greater than the current through diodes $D_1$, but less than the current through diode $D_2$, diode $D_1$ alone will cut off.

As a result, the voltage at junction $J_1$ will rise so that diode $D_{1a}$ is no longer back biased and diode $D_{1a}$ will conduct and an output voltage will be developed across resistor $R_{1a}$ and hence across output terminals 23, 23'. It is to be noted that the resistors $R_N$, $R_2$, $R_1$ have a high value as compared to the forward resistance of diodes $D_{Na}$, $D_{2a}$, $D_{3a}$.

If the input signal provides a current that is greater than the current flowing through diode $D_2$, then of course both diodes $D_{1a}$ and $D_{2a}$ will conduct and output voltages will appear across terminals 23, 23' and 22, 22'. If the input signal provides a current that is greater than the current flowing through diode $D_N$ then all three diodes $D_{Na}$, $D_{2a}$ and $D_{3a}$ will conduct.

If each output is connected to a bi-stable multivibrator, as soon as the signal appears, the multi-vibrator would be locked until the next signal appeared.

The equipment is designed to measure the amplitude of very narrow pulses and of high repetition frequency.

For use with high speed circuits, microwave diodes of the type put out by Sylvania Electric under Model IN 830 would be preferred. For slower operation, conventional diodes are satisfactory.

Thus, we have output signals developed respectively across resistors $R_{1a}$, $R_{2a}$, $R_{Na}$, the current being solely determined by the switching off of diodes $D_1$, $D_2$, $D_N$ and the switching on of diodes $D_{1a}$, $D_{2a}$, $D_{Na}$, said last named diodes taking the place of diodes $D_1$, $D_2$, $D_N$ when the latter are cut off.

With the equipment above described, since the forward resistance of the diodes is extremely small as compared to the value of the resistors 14, $R_N$, $R_2$, $R_1$, the characteristics of the diode are not critical in the functioning of the equipment. With the positive and negative potentials applied to terminals 19 and 16 being from a constant voltage source, it is apparent that by having the resistors of high tolerance which may readily be accomplished, the current at junctions $J_N$, $J_2$, $J_1$ may be established within extremely precise limits. Thus, the switching action of the diodes will occur at substantially exactly the range desired with the use of relatively inexpensive diodes which do not have to be matched and variations in the characteristics of the diode will have no effect on the accuracy of the equipment.

As many changes could be made in the above equipment, and many apparently widely different embodiments of this invention could be made without departing from the scope of the claims, it is intended that all matter contained in the above description or shown in the accompanying drawing shall be interpreted as illustrative and not in a limiting sense.

Having thus described my invention, what I claim as new and desire to secure by Letters Patent of the United States is:

1. Equipment for converting an analog input signal to a digital output signal in step increments each related to a given range of value of said input signal, comprising a plurality of series connected diodes, means to apply a source of potential across said series connected diodes for flow of current therethrough, means to provide successively increasing current flow through each of the diodes of said series, from one end of the series connection to the other, a plurality of output diodes, means connecting each of said output diodes to an associated series connected diode for cut off of said output diode when said associated series connected diode is conducting and for conduction of said output diode when the associated series connected diode is cut off, and means to apply an analog input current through said series connected diodes to oppose the current flow therethrough.

2. Equipment for converting an analog input signal to a digital output signal in step increments each related to a given range of value of said input signal, comprising a plurality of series connected diodes, means to apply a source of potential across said series connected diodes for flow of current therethrough, means to apply a second source of potential of opposite polarity to said first source across all of said series connected diodes except the last diode in the series to provide an additional flow of current through said diodes, means successively to divide the current flow through said series connected diodes for progressively decreasing flow of current through said diodes from the first diode in the series to the last diode in the series, a plurality of output diodes, means connecting each of said output diodes to an associated series connected diode for cut off of said output diode when said associated series connected diode is conducting and for conduction of said output diode when the associated series connected diode is cut off and means to apply an analog input signal current through said series connected diodes to oppose the current flow therethrough.

3. Equipment for converting an analog input signal to a digital output signal in step increments, each related to a given range of value of said input signal comprising a plurality of series connected diodes, a resistor having one end connected to one end of the series connected diodes, means to apply a source of potential across the other end of said resistor and the other end of said series connected diodes for flow of current therethrough, the connection between said resistor and the end of the series connected diode, and the connection between adjacent diodes in the series, each defining a junction, a plurality of resistors each having one end connected to an associated junction between adjacent diodes, means connecting the other ends of said resistors together, means to apply a source of potential to the connected end of the resistors of polarity opposed to the polarity of the source of potential applied to the resistor connected to one end of said series connected diodes, a plurality of output diodes each having one side connected to an associated junction, an output resistor connected at one end to the other side of each of said output diodes, said output diodes being connected for cut off thereof when the associated series diode is conducting and for conduction thereof when the associated series diode is cut off for current flow through said output resistor, and means to apply an analog input current through said series connected diodes to oppose the current flow therethrough.

4. The combination set forth in claim 3 in which the resistors connected to said junctions are of high ohmic value as compared to the forward resistance of said diodes.

5. The combination set forth in claim 3 in which said sources of potential comprise constant voltage sources.

6. The combination set forth in claim 3 in which the means to apply an analog input current through said series connected diode comprises a resistor, an input terminal at one end of said resistor, the other end of said resistor being electrically connected to the end of said series connected diodes to which is connected the resistor to which the first source of potential is applied.

References Cited

UNITED STATES PATENTS

| | | | |
|---|---|---|---|
| 2,733,432 | 1/1956 | Breckman | 340—347 |
| 2,950,469 | 8/1960 | Raasch | 340—347 |
| 3,041,469 | 6/1962 | Ross | 340—347 |
| 3,123,817 | 3/1964 | Golden | 340—347 |
| 3,219,997 | 11/1965 | Lewyn | 340—347 |
| 3,242,479 | 3/1966 | Euler | 340—347 |

MAYNARD R. WILBUR, *Primary Examiner.*

W. J. KOPACZ, *Assistant Examiner.*